United States Patent
Swize

(10) Patent No.: US 6,798,271 B2
(45) Date of Patent: Sep. 28, 2004

(54) CLAMPING CIRCUIT AND METHOD FOR DMOS DRIVERS

(75) Inventor: Gregory Emil Swize, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/249,398

(22) Filed: Apr. 4, 2003

(65) Prior Publication Data

US 2004/0095183 A1 May 20, 2004

Related U.S. Application Data

(60) Provisional application No. 60/319,705, filed on Nov. 18, 2002.

(51) Int. Cl.[7] .............................................. H03K 17/56
(52) U.S. Cl. ...................... 327/424; 327/588; 327/110
(58) Field of Search ................................ 327/423, 424, 327/427, 448, 508, 587, 588, 109, 110, 507; 360/46, 67, 68; 363/58, 63

(56) References Cited

U.S. PATENT DOCUMENTS

| | | | | |
|---|---|---|---|---|
| 5,111,381 A | * | 5/1992 | Pigott et al. | 363/132 |
| 5,191,297 A | * | 3/1993 | Penman et al. | 330/146 |
| 5,287,046 A | * | 2/1994 | Carpenter et al. | 318/293 |
| 5,333,081 A | * | 7/1994 | Mitsui | 360/46 |
| 5,642,247 A | * | 6/1997 | Giordano | 361/31 |
| 5,781,046 A | * | 7/1998 | Ngo et al. | 327/110 |
| 5,818,211 A | * | 10/1998 | Narusawa et al. | 323/312 |
| 5,838,515 A | * | 11/1998 | Mortazavi et al. | 360/78.12 |
| 5,869,988 A | * | 2/1999 | Jusuf et al. | 327/110 |
| 5,880,626 A | * | 3/1999 | Dean | 327/552 |
| 5,896,063 A | * | 4/1999 | Marsh et al. | 330/254 |
| 6,121,800 A | * | 9/2000 | Leighton et al. | 327/110 |
| 6,445,530 B1 | * | 9/2002 | Baker | 360/78.04 |
| 6,486,643 B2 | * | 11/2002 | Liu | 323/268 |
| 6,496,317 B2 | * | 12/2002 | Lacombe | 360/68 |
| 6,545,514 B2 | * | 4/2003 | Barrow | 327/110 |
| 6,617,913 B1 | * | 9/2003 | Johnson | 327/423 |

\* cited by examiner

*Primary Examiner*—Timothy P. Callahan
*Assistant Examiner*—Hai L. Nguyen
(74) *Attorney, Agent, or Firm*—W. Daniel Swayze, Jr.; W. James Brady; Frederick J. Telecky, Jr.

(57) ABSTRACT

A transconductance circuit (16) and method for protecting an H-bridge power circuit (10) that provides power to a load that includes an inductive component (14) connected between one side of the inductive component (14) and a gate (25) of a low side transistor (24) of the H-bridge (10). The transconductance circuit (16) operates to pull current from the inductive component (14) to ground (30) when the inductive load (14) sources current to a body diode of the high side transistor (20). The transconductance circuit (16) creates a regulated voltage to the gate (25) of the low side transistor (24) to cause the low side transistor (24) to conduct the current away in a regulated manner from the inductor (14) and the high side transistor (20) to ground (30).

10 Claims, 2 Drawing Sheets ations.

CLAMPING CIRCUIT AND METHOD FOR DMOS DRIVERS

CROSS REFERENCE TO RELATED APPLICATIONS

This application claims priority from U.S. provisional patent application serial No. 60/319,705 filed Nov. 18, 2002.

BACKGROUND OF INVENTION

1. Field of Invention

This invention relates to improvements in H-bridge driver circuits for driving an inductive load, and more particularly to improvements in driver circuits of the type described that have circuits for diverting current from flowing through a high side driver transistor from the inductive load upon switching.

2. Relevant Background

In systems in which an inductive load is being driven by an H-bridge configuration of FETs, there is the potential for the inductive load to source current through the high-side (HSD) FET body diode and onto the main supply line. This can result in increased supply voltage and damage to components not rated for such a voltage spike. The inductor current being directed to the main supply line must be absorbed by either the main supply or the line load.

Unfortunately, many power supplies exhibit poor or no ability to sink the inductor current. The line load generally consists of a resistive load, a current load, and a capacitive load. The current load can do nothing to absorb the current, and the resistive load can only do so at the price of increasing the voltage on the supply line. If enough capacitance is added to the system, then the capacitance can sink the inductor current, but this is a costly solution. Purchasers of drive electronics which are driving inductive loads would benefit if the drive electronics were able to prevent the inductive current from dumping onto the main supply line.

To address this problem in the past, others have used a zener diode from the middle of the H-bridge to the gate of the low side driver. When the inductor current pushes current into the middle of the H-bridge, the voltage increases, and if the voltage increases enough then the Zener diode breaks down and the low side driver is turned on to shunt the inductor current to ground. However, when using this method it is difficult to control the clamping level of the middle of the H-bridge because it is governed by the threshold voltage of the low side driver power device, the current handling ability of the low side driver, and the breakdown voltage of the zener diode. All three of these parameters can vary greatly from part to part. In some cases the magnitude of the variation for each parameter can be above 15%. This results in a poorly controlled clamping voltage. What is needed, therefore, is a circuit and method to protect the power supply and its components from damaging currents that may be produced by an inductive load in an H-bridge environment. This circuit and method should safely divert damaging currents away from the supply and into the ground in a well regulated manner such that the level at which the middle of the H-bridge is clamped is well controlled.

SUMMARY OF INVENTION

Herein proposed is a solution in which the current from the inductive load is redirected in a regulated fashion to keep the current from pumping up the supply line voltage. The solution conceptually consists of a transconductance loop which regulates the voltage on a low side (LSD) gate to pull current from the inductive load to ground instead of allowing it to flow to the supply. The LSD gate being regulated is on the same half H-bridge as the HSD gate whose body diode is supplying the path for the inductive load to pump up the supply line.

In light of the above, therefore, an advantage of the invention is that by using a transconductance loop approach, the clamping voltage can be made to depend only on a reference voltage, eliminating the dependence of the clamping voltage on transistor characteristics such as threshold voltage and current handling capability. The proposed invention also does not use a Zener diode so there is no dependence on the Zener diode breakdown voltage, which may be poorly controlled.

Another advantage of the invention is that by allowing the clamping voltage to depend only on a reference voltage, the designer can easily design the H-bridge drivers to clamp at any voltage necessary, without being limited to the available zener breakdown voltages and transistor threshold values.

Thus, a circuit is presented that includes circuitry to operate an H-bridge configuration of FETs that are driving an inductive load. A half H-bridge consists of a two transistors: a high side transistor and a low side transistor. The high side transistor has the supply voltage as its drain, the midpoint of the half H-bridge as its source, and an on-off control signal connected to its gate. The low side transistor has the midpoint of the half H-bridge as its drain, the ground (or other sufficiently low voltage) as its source, and the invention herein-described connected to its gate. The inductor has the midpoint of the half H-bridge connected to one of its terminals, and the second terminal is free to connect to any node as long as this second node can carry current.

According to a broad aspect of the invention, a circuit is presented for use in an electrical circuit that includes an inductive load which has a first side driven by an FET pair including a high side transistor connected in series with a low side transistor between a supply voltage and a reference potential. A second side of the inductive load is connected to a circuit capable of carrying current to a reference potential. The high side transistor is of the type that has an associated body diode. The circuit includes circuitry to operate the high side transistor and the circuit capable of carrying current to selectively allow a current to flow from the supply voltage through the high side transistor, the inductor, and the circuit capable of carrying current. A transconductance circuit loop is connected to control the circuit capable of carrying current to pull current from the inductive load to the reference potential when the inductive load sources current to the body diode sufficient to cause the voltage across the body diode to exceed a predetermined trip voltage.

A transconductance loop regulates the voltage on the gate of one of the low side transistors to cause that same low side transistor to regulatedly conduct the inductor current away from the high side transistor to ground. It may include a sense circuit connected to sense the common voltage between a high side driver and a low side driver connected in series to provide a sensed voltage and a compare circuit connected to compare a trip voltage with the sensed voltage to provide an output current to a control element of the low side transistor to cause the low side transistor to conduct an amount of current related to a magnitude of the sensed voltage over the trip voltage.

According to another broad aspect of the invention, a method is presented for operating an H-bridge power circuit that provides power to a load that includes an inductive component. The method includes sensing a voltage between a high side driver and a low side driver of the H-bridge power circuit and, if the voltage exceeds a predetermined level, diverting a current from the high side driver to the low side driver. The diversion of current may be accomplished by diverting the current from the high side driver to the low side driver in relation to a magnitude by which the voltage exceeds the predetermined level.

According to still another broad aspect of the invention, a circuit is provided for protecting the upper transistors of an H-bridge circuit that provides power to a load that has an inductive component. The circuit includes a transconductance circuit loop connected between one side of the inductive component and the gate of a low side transistor of the H-bridge. The transconductance circuit operates to pull current from the inductive component to ground when the inductive load sources current to a body diode of the high side transistor. The transconductance loop creates a regulated voltage to the gate of the low side transistor to cause the low side transistor to regulatedly conduct the current away from the inductor and the high side transistor to ground.

According to still yet another broad aspect of the invention, an H-bridge power circuit is presented for providing power to a load that includes an inductive component. The H-bridge power circuit includes means for sensing a voltage between a high side driver and a low side driver of the H-bridge power circuit, and means for diverting a current from the high side driver to the low side driver if the voltage exceeds a predetermined level. The means for diverting may include means for diverting the current from the high side driver to the low side driver in relation to a magnitude by which the voltage exceeds the predetermined level. The means for diverting may also include means for applying a bias to a control element of the low side driver in relation to a magnitude by which the voltage exceeds the predetermined level. The means for diverting may also include means for developing a regulated bias current and applying the bias current to a control element of the low side driver.

BRIEF DESCRIPTION OF DRAWINGS

The invention is illustrated in the accompanying drawing.

In the drawing.

In the various figures of the drawing, like reference numerals are used to refer to like or similar parts.

DETAILED DESCRIPTION

Figures 1, 2:
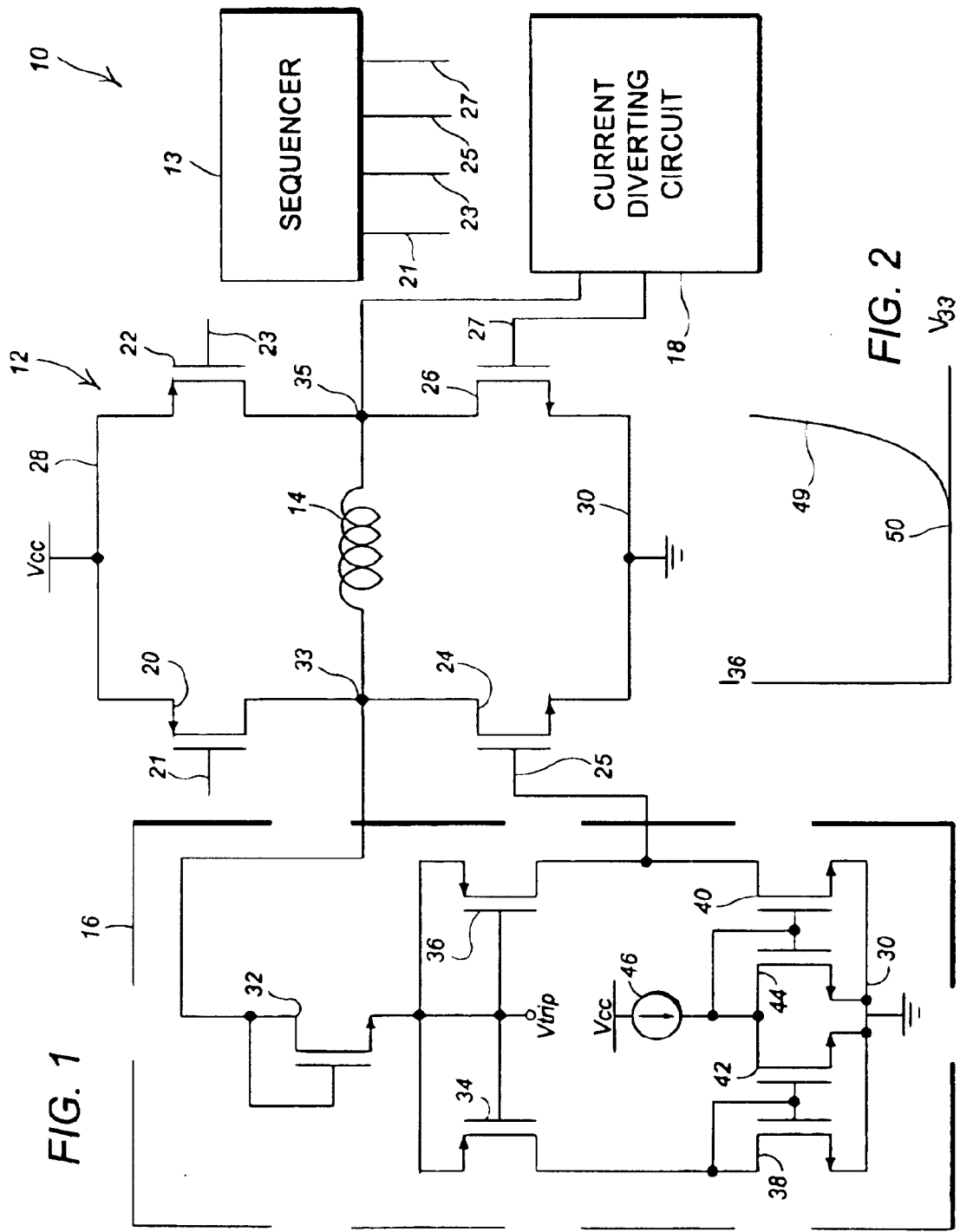
FIG. 1 is an electrical schematic diagram of a particular H-bridge driver circuit implementation which has a pair of current diverting circuits operatively associated therewith, in accordance with a preferred embodiment of the invention.
FIG. 2 is a graph of the current through a control transistor of a current diverting circuit, according to a preferred embodiment of the invention, vs. the voltage on the associated end of an inductive load driven by the H-bridge driver circuit.

A driver circuit 10 is shown in FIG. 1, in which an H-bridge driver 12 has two associated current diverting circuits 16 and 18, according to a preferred embodiment of the invention. The H-bridge circuit is of standard construction, and includes two high side FET transistors 20 and 22 and two low side FET transistors 24 and 26. It should be noted that a pair of circuits is not necessary in the realization of the principles of the invention. In the particular circuit illustrated, two drivers are employed. Generally speaking, if a PWM driver were driving an inductor with one terminal connected to the H-bridge and the second terminal connected to some voltage above ground, it is possible for the inductor current to kick back on the middle-point of the H-bridge and cause the voltage to increase.

Transistors 20 and 24 are connected in series between supply rail Vcc 28 and a reference voltage, or ground, rail 30. Transistors 22 and 26 are connected in series between supply rail Vcc 28 and a reference voltage, or ground, rail 30. The transistors 20, 22, 24, and 26 may be, for example, high current DMOS transistors. A terminal of an inductive load 14 is connected between the source of the high side driver and the drain of the low side driver in each respective leg. The inductive load may be, for example, a motor coil, such as a voice coil motor of the type that is typically used to selectively position the data transducers in mass data storage devices, or the like. Although the inductor load 14 is shown as having only a pure inductive component, it will be understood that capacitive and resistive components may also exist; however, the inductive component is the principle contributor to the flyback current addressed by the current diverting circuit of the invention.

A sequencer circuit 13 is connected to the respective gates 21, 23, 25, and 27 of the DMOS transistors 20, 22, 24, and 26 to apply voltages thereto to cause currents selectively to flow through the inductor 14 in alternate directions in a manner as follows. Typically, voltages may be applied to the gates 21 and 27 of DMOS transistors 20 and 26 to turn them on to define a first current flow path from the Vcc rail 28 through the NMOS device 20, the inductor 14 and NMOS device 26 to the reference potential, or ground, rail 30. In the context of a VCM, this produces acceleration of the data transducer in a first direction. Alternatively, voltages may be applied to the gates 23 and 25 of DMOS transistors 22 and 24 to turn them on to define a first current flow path from the Vcc rail 28 through the NMOS device 22, the inductor 14 and NMOS device 24 to the reference potential, or ground, rail 30. In the context of the VCM, this produces acceleration of the data transducer in a second direction. As mentioned above, however, when the low side driver transistor in an active current flow path is turned off, the voltage on the lowside driver drain rapidly increases. The undesired current flow through the body diode of the upper drive transistor into the Vcc power supply may raise the Vcc power supply voltage and thereby damage components powered from the Vcc power supply.

According to a preferred embodiment of the invention, the potentially damaging flyback currents are diverted through the low side driver transistors to the reference potential, or ground, rail 30. Thus, current diverting circuits 16 and 18 are provided to control the gates of low side NMOS driver transistors and 24 and 26. The current diverting circuit 16, which may be identically constructed to the current diverting circuit 18, includes a diode connected NMOS transistor 32, having its drain connected to node 33 to sense the voltage thereon and a connection to the gate 25 of NMOS transistor 24 to control the current therethrough in a manner below described. The current diverting circuit 18 is similarly connected to the H-bridge 12 at node 35 on the opposite side of the inductor load and a connection to the gate 27 of NMOS transistor 26 to control the current therethrough in a manner below described.

When a current is first flowing from Vcc 28 through high side FET 22, through inductive load 14 and finally through low side FET 24, current diverting circuit 16 is neither pulling current from, nor sourcing current to, gate 25 of transistor 24. Other circuitry whose specific function is to control driver operation may control the gate 25 in any manner required by the drive system in the appropriate manner. When, however, the drive system requires that transistor 24 be turned off, current diverting circuit 16 is enabled to pull down on gate 25. This is effected by turning on current source 46 and sourcing current into the input of a first current mirror pair comprised of transistors 44 and 40. Current flowing into the drain of diode-connected transistor 44 causes a proportional current to flow into the drain of transistor 40. The current flowing into the drain of transistor 40 pulls down on gate 25 and turns off transistor 24.

Two voltage-sensing transistors are provided in the current diverting circuit 16 which includes PMOS input transistors 34 and 36 having a user controllable reference voltage, Vtrip, applied to the gates thereof. Thus, when the voltage on node 33 exceeds the reference voltage Vtrip plus the gate-to-source voltages of transistor 32 and transistor 36 or 34, the transistors 34 and 36 begin to conduct, as shown in the graph of FIG. 2, to which reference is now additionally made. The transistors 34 and 36 are sometimes referred to herein as voltage-sensing transistors. Current flowing through transistor 36 to gate 25 raises the voltage on gate 25 thus turning DMOS transistor 24 on. Current flowing through transistor 34 flows into the input of a second current mirror pair comprised of transistors 38 and 42. Current flowing into the drain of diode-connected transistor 38 causes a proportional current to flow into the drain of transistor 42. Current flowing into the drain of transistor 42 reduces by an identical amount the amount of current from current source 46 that flows into the first current mirror pair comprised of transistors 44 and 40. This in turn reduces the amount of current being pulled from gate 25 by transistor 40. The current being sunk by transistor 40 and the current sourced by transistor 36 work to move the voltage on gate 25 in such a manner as to prevent the voltage on node 33 from exceeding the desired voltage. The ratio of transistor pairs 34 and 36, 38 and 42, and 44 and 40 do not have to be unity and may in fact be chosen to meet various design criteria. For example, transistor 40 may be sized to be 5 times larger than transistor 44 in order to provide 5 times the pull down current to transistor 24 to meet a slew rate requirement when turning off transistor 24. As another example, transistor 36 may be 4 times larger than transistor 34 allow fast rising voltages on node 33 to more quickly pull up on gate 25.

The graph in FIG. 2 shows the current flowing through NMOS transistor 36, denoted $I_{36}$, as a function 49 of the voltage on node 33, denoted $V_{33}$. It can be seen that no current is delivered to the gate of NMOS transistor 24 until the voltage on node 33 exceeds the sum of the trip voltage, Vtrip plus the gate to source voltages of NMOS transistor 32 and PMOS transistor 36. As the voltage on node 33 continues to rise above the threshold 50, the current through PMOS transistor quadratically rises, which quadratically increases the current supplied to charge the gate of the lower NMOS driver transistor.

As a result, when the voltage on node 33 increases, caused by the inductor 14, the current diverter circuit 16 increases the conduction of the lower NMOS driver transistor 24 to pull or divert to ground the current which otherwise would flow through the upper PMOS driver transistor 20 to the power supply. Thus, by using a transconductance loop approach, the clamping voltage can be made to depend only on the reference voltage, Vtrip, enabling the specific transistor characteristics to be properly matched. The voltage Vtrip may be generated in such a way as to be dependent on a reference voltage minus the voltage drop in a an NMOS transistor matched to NMOS transistor 32 and a PMOS transistor matched to PMOS transistors 34 and 36. The bias current of the devices setting Vtrip should be made proportional to the current flowing through transistor 32 when the current diverting circuit 16 is effectively regulating the voltage at node 33.

Figure 3:
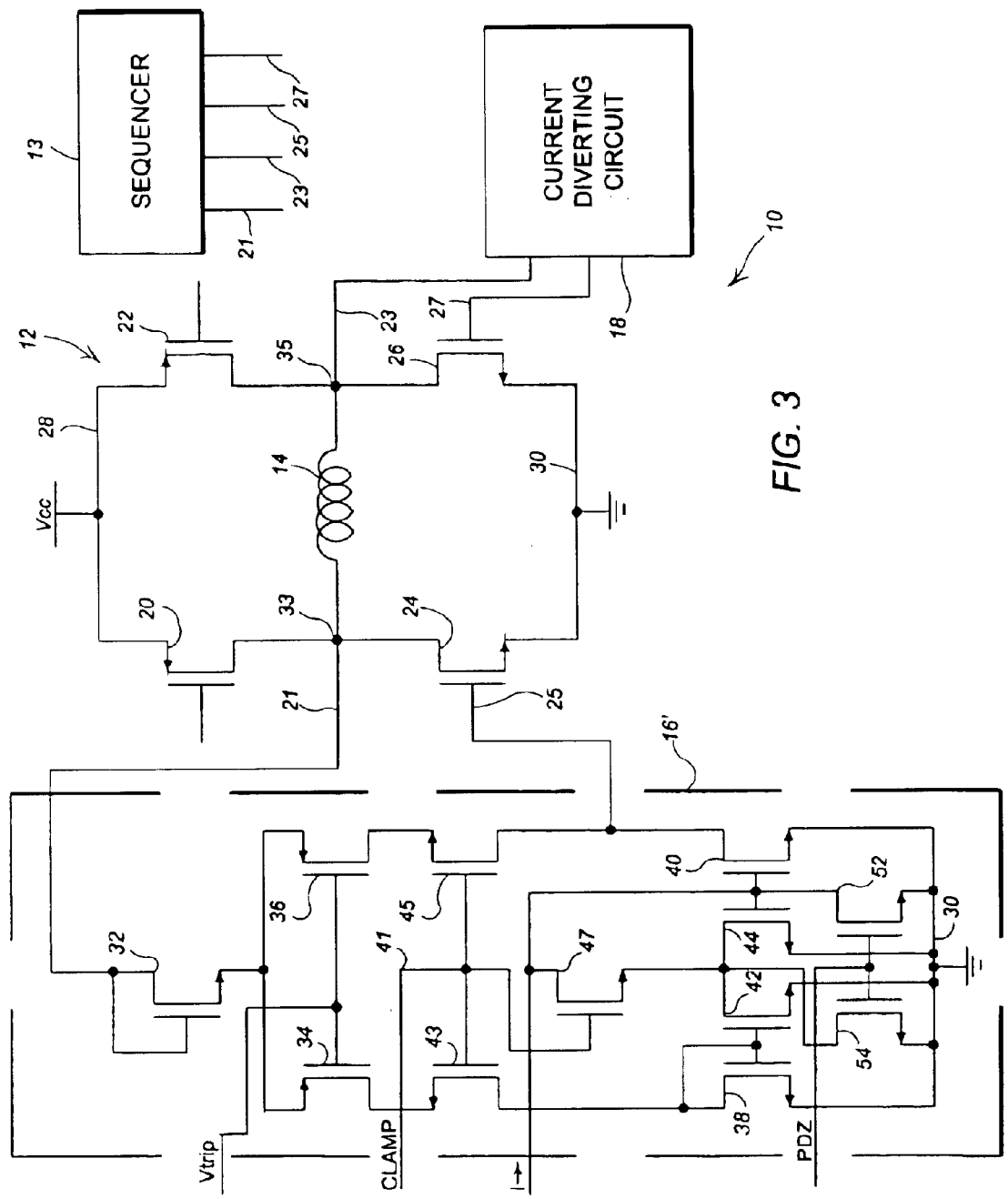
FIG. 3 is an electrical schematic diagram of another embodiment of a particular H-bridge driver circuit implementation which has a pair of current diverting circuits operatively associated therewith, in accordance with a preferred embodiment of the invention.

With reference additionally now to FIG. 3, another current diverting circuit embodiment 16' shown. The current diverting circuit 16' includes various claming devices to lower current consumption of the circuit when the clamps are inactive. Thus, a voltage "CLAMP" is applied on line 41 to the gates of NMOS transistors 43, 45, and 47. Current, I, on line 45 is injected into the drain of NMOS transistors 47 and the gates of NMOS transistors 40 and 44. Clamp transistor 54 is connected between the drains of transistors 42 and 44 and the ground rail 30, and clamp transistor 52 is connected between the gates of transistors 40 and 44 and the ground rail 30.

In operation, transistor 47 enables and disables the current mirror created by transistor pair 40 and 44. When the clamp is on, transistor 47 is on, the current mirror is enabled, and the current, I, on line 41 is mirrored from transistor 44 to transistor 40. In this state, the transistor 40 does not pull the gate of the power DMOS transistor 24 down. Also, in this state, transistor 52 shuts off transistor 40.

However, when the clamp is off, transistors 47, 42 and 44 are off, and transistor 54 operates to prevent the drains of transistor 42 and 44 from floating. At the same time, the current, I, pulls the gate of transistor 40 up, turning it on hard.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. In an electrical circuit including an inductive load which has a first side driven by an FET pair including a high side transistor connected in series with a low side transistor between a supply voltage and a reference potential, wherein a second side of said inductive load is connected to a current carrying circuit capable of carrying current to a reference potential, and wherein said high side transistor has an associated body diode, a circuit comprising:

circuitry to operate said high side transistor and said current carrying circuit capable of carrying current to selectively allow a current to flow from said supply voltage through said high side transistor, said inductor, and said circuit capable of carrying current; and a transconductance circuit loop including a transconductance circuit connected to control said current carrying circuit capable of carrying current to pull current from said inductive load to said reference potential when said inductive load sources current to said body diode sufficient to cause the voltage across said body diode to exceed a predetermined trip voltage.

2. The circuit of claim 1 wherein said current carrying circuit capable of carrying current includes a second low side transistor and wherein said transconductance loop creates a regulated voltage to a gate of said second low side transistor to cause said second low side transistor to regulatedly conduct said current away from said inductor and said high side transistor to said reference potential.

3. In an electrical circuit including an inductive load which has a first side driven by an FET pair including a high side transistor connected in series with a low side transistor between a supply voltage and a reference potential, wherein a second side of said inductive load is connected to a current carrying circuit capable of carrying current to a reference potential, and wherein said high side transistor has an associated body diode, a circuit comprising:

circuitry to operate said high side transistor and said current carrying circuit capable of carrying current to selectively allow a current to flow from said supply voltage through said high side transistor, said inductor, and said circuit capable of carrying current; and a transconductance circuit loop connected to control said current carrying circuit capable of carrying current to pull current from said inductive load to said reference potential when said inductive load sources current to said body diode sufficient to cause the voltage across said body diode to exceed a predetermined trio voltage, wherein said transconductance loop comprises:

a sense circuit connected to sense a voltage on a node between said high side transistor and said low side transistor to provide a sensed voltage;

a compare circuit connected to compare said trip voltage with the sensed voltage to provide an output current to a control element of said circuit capable of carrying current to cause said current carrying circuit capable of carrying current to conduct amount of current related to a magnitude of said sensed voltage over said trip voltage.

4. The circuit of claim 3 wherein said compare circuit comprises a pair of FET compare devices having interconnected gates connected to said trip voltage, wherein said FET compare devices conduct when said sensed voltage exceeds said trip voltage plus a gate to source voltage drop on one of said FET compare devices.

5. The circuit of claim 4 further comprising a sinking circuit for sinking a constant current from a gate of said low side driver transistor.

6. A circuit for protecting upper transistors of an H-bridge circuit that provides power to a load that has an inductive component, comprising:

a transconductance circuit loop including a transconductance circuit connected between one side of said inductive component and a gate of a low side transistor of said H-bridge, said transconductance circuit operating to pull current from said inductive component to ground when said inductive load sources current to a body diode of said high side transistor.

7. The circuit of claim 6 wherein said transconductance loop creates a regulated voltage to said gate of said low side transistor to cause said low side transistor to regulatedly conduct said current away from said inductor and said high side transistor to ground.

8. A circuit for protecting upper transistors of an H-bridge circuit that provides power to a load that has an inductive component, comprising:

a transconductance circuit loop connected between one side of said inductive component and a gate of a low side transistor of said H-bridge, said transconductance circuit operating to pull current from said inductive component to ground when said inductive load sources current to a body diode of said high side transistor, wherein said transconductance loop further comprises:

a sense circuit connected to sense a voltage on a node between said high side driver and said low side driver to provide a sensed voltage;

a compare circuit connected to compare a trip voltage with said sensed voltage to provide an output current to a control element of said low side transistor to cause said low side transistor to conduct amount of current related to a magnitude of said sensed voltage over said trip voltage.

9. The circuit of claim 8 wherein said compare circuit comprises a pair of FET compare devices having interconnected bases connected to a trip voltage, wherein said FET compare devices of said compare circuit conduct when said sensed voltage exceeds said trip voltage plus a gate to drain voltage drop on one of said FET compare devices.

10. The circuit of claim 9 further comprising a sinking circuit for sinking a constant current from a gate of said low side driver transistor.

* * * * *